United States Patent [19]

Morris et al.

[11] 4,320,338

[45] Mar. 16, 1982

[54] METHODS OF AND APPARATUS FOR DETERMINING THE CAPACITANCE OF A TRANSMISSION LINE BY INTEGRATING LINE CURRENTS

[75] Inventors: Darryl C. Morris; Normand A. Saucier, both of Concord; Lot Phillips, Brookline, all of N.H.

[73] Assignee: Northern Telecom, Inc., Nashville, Tenn.

[21] Appl. No.: 110,478

[22] Filed: Jan. 8, 1980

[51] Int. Cl.³ .................. G01R 27/26; G01R 31/08
[52] U.S. Cl. ........................ 324/60 C; 179/175.3 F; 324/52; 324/60 CD; 364/830
[58] Field of Search ............ 324/52, 54, 51, 60 C, 324/60 CD, 76 A, 73 R; 320/1; 307/360, 361; 328/114, 132; 364/829-831, 482; 179/175.3 F

[56] References Cited

U.S. PATENT DOCUMENTS

| | | | |
|---|---|---|---|
| 2,476,317 | 7/1949 | Nelson et al. | 324/52 |
| 2,615,076 | 10/1952 | Miller | 324/52 |
| 3,242,327 | 3/1966 | Burk et al. | 364/830 X |
| 3,290,586 | 12/1966 | Anderson | 324/52 |
| 3,452,272 | 6/1969 | Collins et al. | 324/60 CD |
| 3,476,924 | 11/1969 | Conger | 364/830 |
| 3,544,983 | 12/1970 | Wallace et al. | 307/361 X |
| 3,800,216 | 3/1974 | Hamilton | 324/52 |
| 3,944,914 | 3/1976 | Simmonds | 324/52 X |
| 4,032,841 | 6/1977 | Knippelmier | 324/60 CD |
| 4,103,225 | 7/1978 | Stephens | 324/52 X |

Primary Examiner—Gerard R. Strecker
Attorney, Agent, or Firm—Spencer & Kaye

[57] ABSTRACT

Apparatus is disclosed for automatically measuring accurately and rapidly alternating and direct voltages, resistance, and capacitance of a telephone line. Direct voltages and relatively high resistances can be determined by filtering out 60 Hz a.c. signals and measuring line current with and without a voltage source connected in series with the line. Capacitance is measured by charging the line from the voltage source, discharging the line into a plurality of integrators having different time constants, and sampling the output voltage of one of the integrators after a respective integral number of 60 Hz periods. The integrator whose output voltage is sampled depends on the capacitance being measured. The resultant measurement is corrected in respect of voltages on the line by performing a second integration without again charging the line, and the corrected result is modified to take into account the previously measured resistance of the line.

25 Claims, 4 Drawing Figures

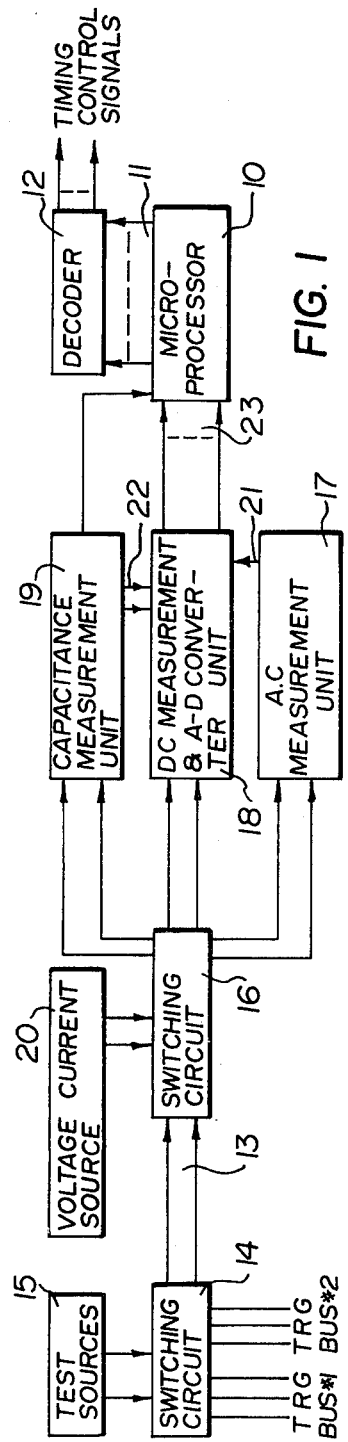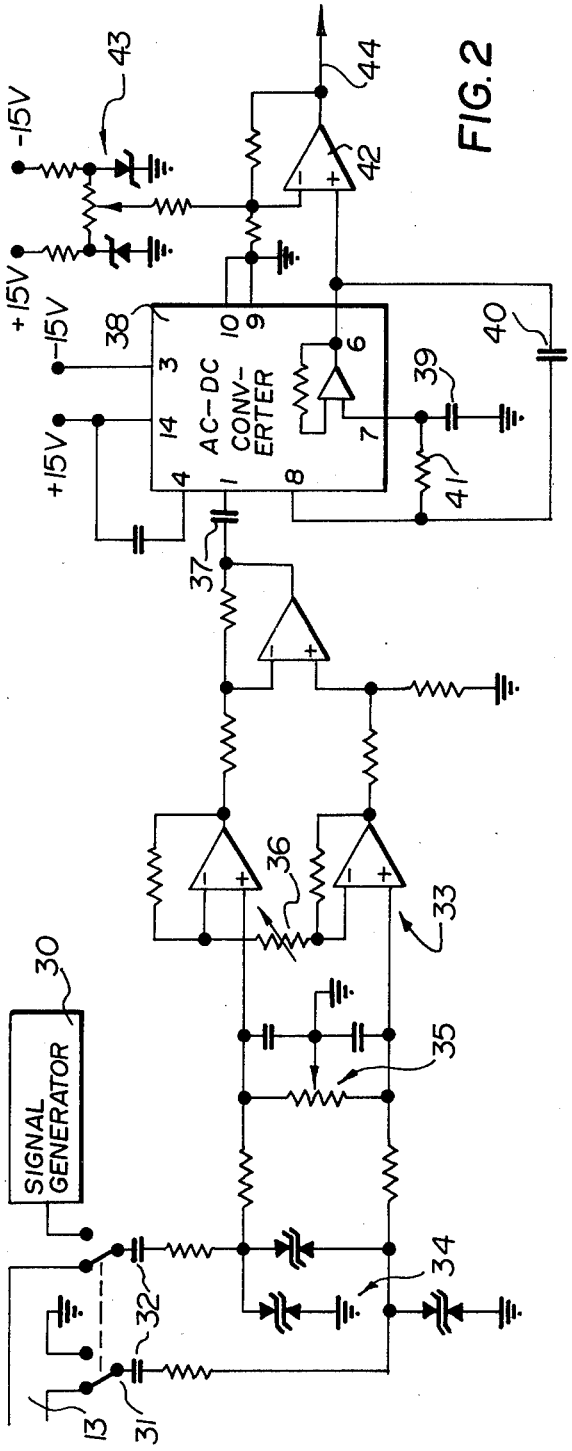

METHODS OF AND APPARATUS FOR DETERMINING THE CAPACITANCE OF A TRANSMISSION LINE BY INTEGRATING LINE CURRENTS

This invention relates to a method of and apparatus for determining electrical characteristics of a transmission line such as a telephone line.

Telephone companies frequently require to measure parameters of subscribers' telephone lines, either in trouble-shooting lines suspected of having faults or in routine examination of all lines of an exchange, for example to identify lines with potential fault conditions. More particularly, specific electrical tests are required to enable detection of conditions producing or having the potential to produce faults.

A measurement of a.c. voltage on the line enables the line to be checked for excessive levels of a.c. voltage, which can cause hum in a subscriber's receiver and malfunctioning of signalling equipment. Such excessive levels of a.c. voltage can be caused by inadvertent connection of the line to utility power lines, or by induction from such lines as a result of the telephone and power lines running parallel to one another over a long distance.

A determination of d.c. voltage carried by the line, and the resistance between the wires of the line and between the wires and ground, referred to herein as leakage resistance, enables detection of various conditions. D.C. voltages carried by the line may arise from certain types of customer equipment, or from faults such as the wires of two telephone lines being inadvertently connected together, or electrolytic action caused by water in cables. Relatively low leakage resistances (down to about 10kΩ) can be caused by certain types of customer equipment, or by faults such as pinholes in the insulation between the wires of a telephone line, breakdown of the insulation, and water in buried cables. Such faults tend to cause progressively deteriorating performance and should therefore desirably be identified as soon as possible. These faults can give rise to noise on a subscriber's line, high loss to voice frequency signals, and, if severe enough, malfunctioning of signalling equipment. Furthermore, they can give rise to excessive induction from utility power lines, as already discussed above, as a result of degraded balance between the wires of the line. For this last reason in particular, it is desirable to be able to determine accurately the direct voltage on and resistance of the line in the presence of relatively high levels of a.c. voltage carried by the line. Lower resistance measurements than about 10kΩ are useful in checking several normal line conditions, such as the loop resistance of a subscriber's line with the telephone off-hook, and in trouble-shooting a line which has a low resistance short, in which case the approximate location of the short can be determined from the resistance measurement and the known telephone line resistance per unit length.

A determination of the capacitance of the line enables the approximate location of an open circuit in one wire of the line to be determined, this being a relatively common fault, by measuring the capacitance of each wire to ground and from the known line capacitance per unit length. As a telephone ringer also contains capacitance, it is also possible to use a capacitance measurement to determine approximately how many ringers are connected to a telephone line.

Accordingly, it can be seen that there is a need for apparatus for effecting the various measurements discussed above, and for performing these measurements under numerous and varied line conditions sufficiently accurately to ensure that the measurements are useful in detecting and locating faults. Furthermore, at least in the case of routine examination of lines it is desirable to be able to perform all of the desired measurements in respect of each line in a relatively short period of for example about 10 seconds. It is further desirable to be able to effect the measurements automatically and at a location which may be normally unattended and remote from a central test station.

An object of this invention is to provide improved methods of an apparatus for determining electrical characteristics, in particular the capacitance, of a transmission line.

According to one aspect of this invention there is provided apparatus for determining the capacitance of a transmission line, comprising: a plurality of integrators having different integration time constants; means for charging the line to a predetermined voltage, and for discharging the line and integrating the discharge current simultaneously in the plurality of integrators; comparison means, associated with at least each integrator except that having the largest integration time constant, for producing a signal if an output voltage of the respective integrator exceeds a predetermined level; and sampling means for sampling the output voltage of that one of the integrators which has the smallest integration time constant and in respect of which no said signal is produced within a predetermined period commencing with the start of the discharge, said signal(s) and the sampled output voltage constituting a measure of said capacitance. Preferably the sampling means is arranged for sampling the output voltage of each integrator at the end of a predetermined period individually assigned to the respective integrator, each integrator having a relatively larger integration time constant being assigned a relatively longer predetermined period.

This arrangement considerably facilitates the making of capacitance measurements rapidly. For example, in an embodiment of the invention described below there are three integrators (although obviously a different number may be provided) having successively longer integration time constants. If the line capacitance is small, then within the predetermined period associated with the first, or smallest integration time constant, integrator its output voltage does not exceed the predetermined level, and consequently is sampled at the end of this period whereupon the capacitance measurement is completed very quickly. Only if the line capacitance is larger does the measurement involve sampling of the next integrator at the end of its longer predetermined period, and only if the capacitance is very large does the measurement last until the sampling of the final (largest integration time constant) integrator at the end of the longest predetermined period. Thus the arrangement provides a large measurement range, but ensures that small capacitance values are measured rapidly, providing an increased speed of measurement on average for a large number of measurements.

According to another aspect of this invention there is provided apparatus for determining the capacitance of a transmission line, comprising: means for charging the line to a predetermined voltage; means for discharging the line and for effecting an integration of discharge current from the line to produce a first measurement of the capacitance of the line; and means for effecting an integration of current from the discharged line to produce a second measure equivalent to a capacitance, which second measure can be subtracted from the first measure to produce a resultant, more accurate, measure of the capacitance of the line.

The second measure in this arrangement is in fact a measure of current from the line which is produced by any small direct voltage which may exist on the line. Subtraction of the second measure from the first measure consequently eliminates the effect on the capacitance measurement of any such direct voltages, and improves the measurement accuracy. The accuracy of the resultant measurement can be further improved by modifying the resultant measure in accordance with a measurement of the leakage resistance of the line, to compensate for the effect of leakage on the discharge of the line.

A combination of the aspects of the invention described above results in an arrangement which can provide both rapid and accurate capacitance measurements in the presence of both direct voltages on the line and substantial leakage resistance of the line. In order that the capacitance measurements can also be carried out in respect of lines which carry alternating voltages at a predetermined frequency, such as voltages induced from power lines at a frequency of 60 Hz, each of the integrations referred to above is effected over a period which is an integral multiple of the period of such frequency. This results in the integrated value of the alternating voltage being zero so that it has no effect on the capacitance measurement.

The apparatus of the invention preferably includes means for determining values of direct voltage applied to and leakage resistance of the transmission line, comprising: a constant voltage source; a low-pass filter; a resistance network; means for connecting said resistance network to said transmission line in a first step to develop across a resistance of said resistance network a first direct voltage which is dependent upon current flow in the transmission line, and for connecting said resistance network in series with said constant voltage source to said transmission line in a second step to develop across a resistance of said resistance network a second direct voltage which is dependent upon current flow in the transmission line; and means responsive to said first and second direct voltages, filtered by said low-pass filter, for calculating said values of direct voltage applied to and leakage resistance of the transmission line.

In order to be able to conduct reliable d.c. measurements in the presence of significant levels of a.c. carried by the line, the low-pass filter preferably comprises a plurality of low-pass filter sections and a notch filter section having a high attenuation at the predetermined frequency of the a.c., e.g. 60 Hz. In order to facilitate rapid measurements the notch filter section is designed to provide a minimal settling time, so that measurements of the desired accuracy can be effected with as little delay as possible.

The apparatus preferably also includes means for measuring alternating voltages on the line.

The invention also extends to methods of determining the capacitance of a transmission line in the ways discussed above.

The invention will be further understood from the following description of a preferred embodiment thereof with reference to the accompanying drawings, in which:

FIG. 1 illustrates in a block diagram a test apparatus for determining electrical characteristics of telephone lines;

FIG. 2 illustrates an a.c. measurement unit of the apparatus;

Figure 3:
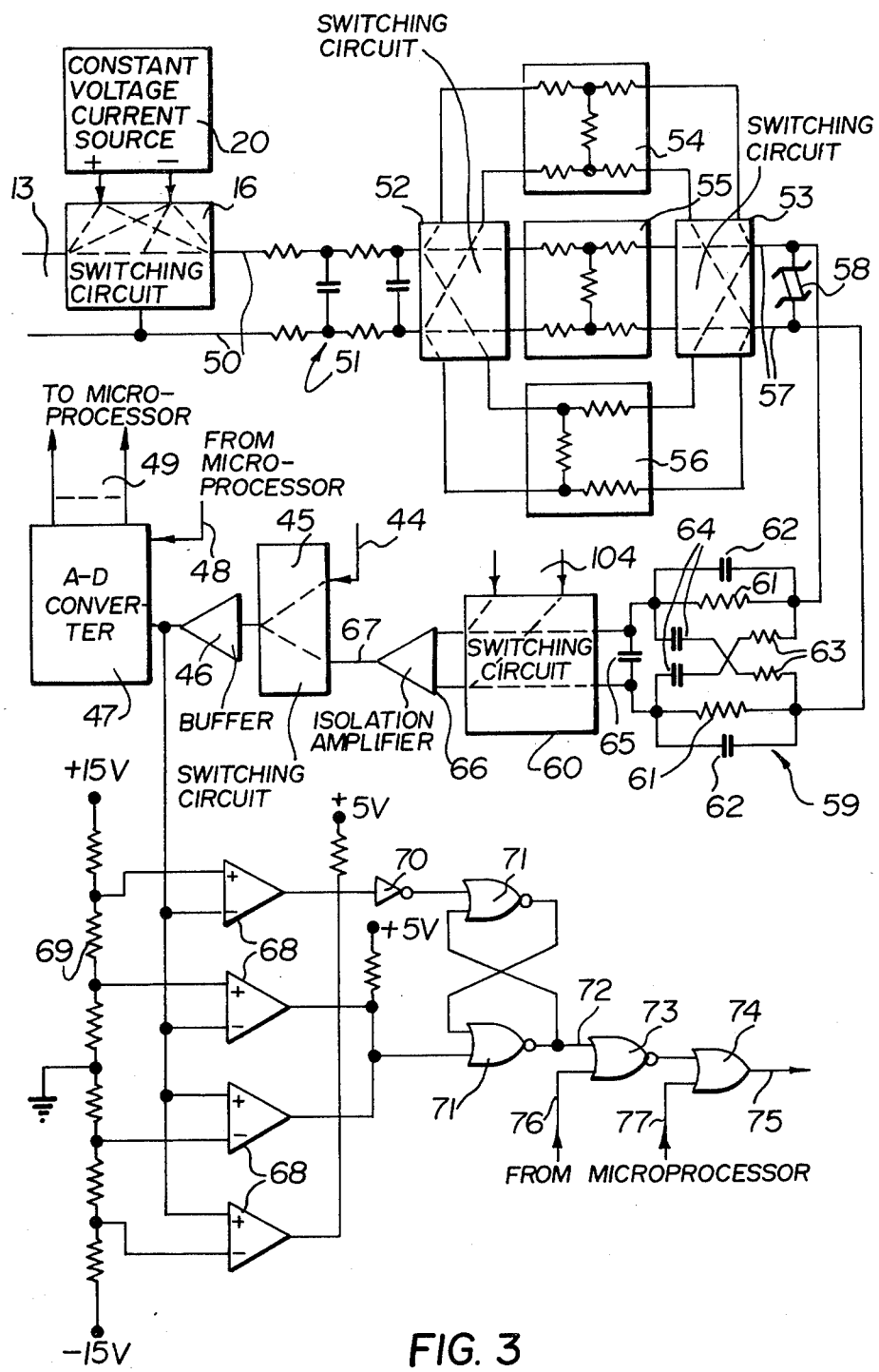
FIG. 3 illustrates a d.c. measurement and analog-to-digital (A-D) converter unit of the apparatus.

Referring to FIG. 1, the test apparatus shown therein comprises a microprocessor 10 under the control of which the electrical characteristics of telephone lines can be determined. The microprocessor 10 emits signals via lines 11 to a decoder 12 to produce timing and control signals which are supplied to the rest of the apparatus for timing and control purposes. The structure and operation of microprocessors and decoders are well known in themselves and accordingly need not be described here. The test apparatus can be a remote unit which forms part of an automated loop reporting system having a central unit which can communicate with the microprocessor of the test apparatus via a telephone line or a data link.

The test apparatus can perform various electrical measurements on a two wire line 13, which measurements can be performed individually as required or sequentially. The line 13 is connected via a switching circuit 14 to one of a plurality of telephone lines BUS #1, BUS #2 or to test sources 15. More particularly, the switching circuit 14, under the control of the decoder 12, connects a pair of wires of selectively BUS #1 or BUS #2, or a pair of wires connected to the test sources 15, to the line 13. Each line BUS #1, BUS #2 consists of tip and ring wires T and R respectively, and a ground G which may differ from the local ground at the test apparatus. For example, for measurement of each line BUS #1, BUS #2, the switching circuit 14 can connect to the line 13 selectively either the wires T and R, or T and G, or R and G, or T and R connected together and G, of the respective line for various measurements thereof. The switching circuit 14 is arranged so that when none of the wires of the lines BUS #1, BUS #2 is connected to the line 13, the test sources 15 are connected to the line 13. The test sources 15 consist of fixed values of resistance and capacitance, and predetermined voltage sources, which can be switched selectively under the control of the decoder 12 to provide a simulated telephone line of known characteristics to enable checking of the operation of the test apparatus. In the following description references are made for convenience merely to the line 13, but such references are of course intended to embrace not only the line 13 itself but also the wires or test sources to which the line 13 is connected via the switching circuit 14.

The line 13 is connected via a switching circuit 16 selectively to the input of one of an a.c. measurement unit 17, a d.c. measurement and A-D converter unit 18, and a capacitance measurement unit 19, which units are described in detail below with reference to FIGS. 2, 3, and 4 respectively. The switching circuit 16 can also selectively connect a floating voltage or current source 20 to the line 13, which source 20 selectively provides a stable and precise 50 volts or 4 mA d.c. supply. The operation of the switching circuit 16 will be clear from the more detailed description with reference to FIGS. 2 to 4.

The unit 18 incorporates an A-D converter which converts analog d.c. measurement values produced in the unit 18, or measurement values supplied thereto from the unit 17 via a wire 21 or from the unit 19 via wires 22, into corresponding digital values which together with range information are supplied via wires 23 to the microprocessor 10. The unit 19 also supplies signals to the microprocessor 10 as is more fully described with reference to FIG. 4.

The switching circuits 14 and 16, as well as switching circuits provided for selecting the test sources 15, controlling the source 20 to act selectively as a voltage or current source, and provided in the units 17 and 18 as described below, conveniently comprise relays which are controlled by the decoder 12 and whose contacts perform the various switching operations.

The a.c. measurement unit 17, which serves to measure alternating voltages on the line 13, is shown in detail in FIG. 2. For a.c. measurement, the switching circuit 16 connects the line 13 directly to the input of the unit 17, the voltage/current source 20 being unconnected.

Referring to FIG. 2, the unit 17 includes a signal generator 30 which, when energised, generates an alternating voltage signal, for example a square wave, of known magnitude for testing purposes. A switch 31, which may comprise contacts of a relay controlled by the decoder 12, selectively connects either the output of the generator 30 or the line 13 to coupling capacitors 32 and thence to the input of a balanced differential a.c. amplifier 33. The input of the amplifier 33 is protected from excessive voltages by oppositely-poled series-connected zener diodes 34 connected between the input wires and between each wire and ground. The amplifier 33 includes a potentiometer 35 for common mode rejection adjustment, and a variable resistor 36 for gain adjustment.

The output of the amplifier 33 is connected via a coupling capacitor 37 to the input of an a.c. to d.c. converter and filter device 38, which is a type AD536J integrated circuit whose pin numbers are indicated in FIG. 2. The output, at pin 8, of the a.c. to d.c. converter part of this device is connected to the input of the filter part of this device 38, which part also comprises 1 $\mu$F capacitors 39 and 40 and a 24.3k$\Omega$ resistor 41. The output, at pin 6, of the filter is connected to the input of a buffer amplifier 42 provided with an offset adjustment circuit 43. The amplifier 42 produces on an output wire 44 a direct voltage representative of any alternating voltage present on the line 13.

Referring to the central part of FIG. 3, the wire 44 is connected to an input of a switching circuit 45 which, for a.c. measurement, connects the wire 44 via a buffer amplifier 46 to the anolog signal input of an A-D converter 47, which on receipt of a 'convert' command from the microprocessor 10 via a wire 48 converts the received analog signal into a corresponding digital signal which it supplies to the microprocessor via output leads 49, corresponding to some of the wires 23 in FIG. 1.

FIG. 3 also illustrates parts of the apparatus which are used in carrying out d.c. measurements, and for convenience also shows the switching circuit 16 and voltage/current source 20 of FIG. 1. The d.c. measurement which the apparatus can effect comprise a two-part 'foreign emf. and leakage resistance' measurement, referred to hereinafter as an FL measurement; a direct voltage measurement; and a low resistance measurement.

In a first part of the FL measurement, the switching circuit connects the line 13 directly to the input wires 50 of the unit 18, the source 20 being unconnected. The input wires 50 are connected via a low-pass filter 51, comprising two sections of series resistors and shunt capacitors, to the input of a switching circuit 52. The switching circuit 52 and a subsequent switching circuit 53 are controlled by the decoder 12 in FIG. 1 to connect a selected one of three resistance networks 54, 55, and 56 between the input of the switching circuit 52 and the output wires 57 of the switching circuit 53, depending upon whether an FL, direct voltage, or low resistance measurement respectively is being conducted. The general form of each resistance network is illustrated in FIG. 3, but each resistance network also includes further resistances and range switches for switching between different ranges, the switching being controlled by range-determining circuitry described below. The range switching arrangements are not illustrated because these can be provided in well-known manner in accordance with the desired range. It is sufficient here to observe that in the illustrated apparatus two alternative ranges are provided for each of the FL, direct voltage, and low resistance measurements, and in each case the relevant resistance network and range switching is arranged so that a direct voltage of $\pm 2.5$ volts between the wires 57 corresponds to a maximum or 'full-scale' valve for the relevant measurement and range.

A surge voltage protector 58 is connected between the wires 57, which are connected via a filter generally referenced 59 to an input of a switching circuit 60. The filter 59 consists of a 39.2 k$\Omega$ resistor 61, in parallel with a 0.068 $\mu$F capacitor 62, in series with each of the two wires 57, with cross-connections of an 18.6 K$\Omega$ resistor 63 in series with a 0.136 $\mu$F capacitor 64 between each wire 57 and the other wire at the output side of the filter. These parts of the filter 59 form a notch filter with the notch being located at a frequency of 60 Hz. A 0.04 $\mu$F shunt capacitor 65 is connected at the output side of the filter, and together with series resistances forms a further low-pass filter section. It is noted here that the filters 51 and 59 together form a multiple section low-pass filter having a deep notch, or high attenuation band, with a low Q factor centered on a frequency of 60 Hz. The filters thus allow passage of d.c. signals but have a high rejection of a.c. signals at a frequency of 60 Hz due to the notch and at harmonics of this frequency due to the low-pass filter sections. This enables accurate d.c. measurements to be made even in the presence of large 60 Hz a.c. voltages on the line 13, which a.c. voltages may be greater than the d.c. voltages being measured. Furthermore, the filters are designed to provide a minimal settling time, of about 0.1 second, to the desired measurement accuracy to enable rapid measurement.

The output of the switching circuit 60 is connected to the input of an isolation amplifier 66, which is a chopper type d.c. amplifier, for example Analog Devices type AD275L, having a gain of four, which provides a $\pm 10$ volt fullscale output via a wire 67 to a second input of the switching circuit 45. During d.c. measurements, the switching circuits 45 and 60 are controlled by the decoder 12 in FIG. 1 to connect the output of the filter 59 via the isolation amplifier 66 to the buffer amplifier 46, and thence to the A-D converter 47.

The output of the buffer amplifier 46 is also connected to a range-determining circuit shown in the lower half of FIG. 3, which includes four comparators 68 each of which compares the output voltage of the buffer amplifier 46 with a respective positive or negative reference voltage obtained from a voltage divider chain 69. The comparator 68 outputs constitute inputs to a bistable stage constituted by an inverter 70 and two cross-coupled NOR gates 71, and control this bistable stage to produce a range signal on a wire 72. It will be recalled that in this case there are two ranges, a low and a high range, for each d.c. measurement. A logic '0' on the wire 72 corresponds to selection of the low range, and a logic '1' on this wire 72 corresponds to selection of the high range. When the low range is selected, the comparators 68 respond to an excessive input voltage from the buffer amplifier 46 to change the state of the bistable stage to produce a '1' on the wire 72 for selection of the high range. When the high range is selected, the comparators 68 respond to an insufficient input voltage from the buffer amplifier 46 to change the state of the bistable stage to produce a '0' on the wire 72 for selection of the low range.

The wire 72 is connected via a NOR gate 73 and an OR gate 74 to a 'range select' wire 75, on which a logic '1' or '0' causes the low or high range, respectively, to be selected. Wires 76 and 77, leading from the microprocessor, are connected to second inputs of the gates 73 and 74 respectively. If a logic 1 0' is present on each of these wires 76 and 77, then the signal on the wire 72 determines the range selection. However, the microprocessor can supply a logic '1' on the wire 76, which enables it to override the autorange signal on the wire 72 and to control the range selection itself via the wire 77.

It should be appreciated from the above description that, in the first part of the FL measurement, the A-D converter 47 supplies to the microprocessor a digital value representative of the direct voltage dropped across a resistance (in the resistance network 54) connected across the line 13, and hence representative of the current flow in the line. In a second part of the FL measurement, the decoder 12 controls the source 20 to operate as a constant 50 volt voltage source and controls the switching circuit 16 to connect this voltage source in series with the line 13, with a selected polarity opposite to that of the direct voltage measured in the first part of the measurement to ensure the best dynamic measurement range. A second measurement is then made and a second resulting digital value is supplied by the A-D converter to the microprocessor via the wires 49. From these two digital values, the known value of resistance connected across the line 13, and the known value (50 volts) of the supply voltage, the microprocessor calculates the Thevenin voltage and Thevenin resistance of the line 13, corresponding to the foreign emf. and leakage resistance of the line.

In the event that the line 13 carries a relatively high d.c. voltage and/or has a relatively low leakage resistance, the FL measurement described above may be out of range. In this case, the d.c. voltage of the line 13 can be measured directly by the decoder 12 controlling the switching circuit 16 to connect the line 13 directly to the input wires 50 with the source 20 unconnected, and controlling the switching circuits 52 and 53 to connect the resistance network 55 in place of the resistance network 54. Furthermore, the resistance can be measured directly by the decoder 12 controlling the source 20 to operate as a constant 4 mA current source, controlling the switching circuit 16 to connect the line 13 to the input wires 50 and to connect the current source 20 across the line 13, and controlling the switching circuits 52 and 53 to connect the resistance network 56 in place of the resistance network 54 or 55.

Figure 4:
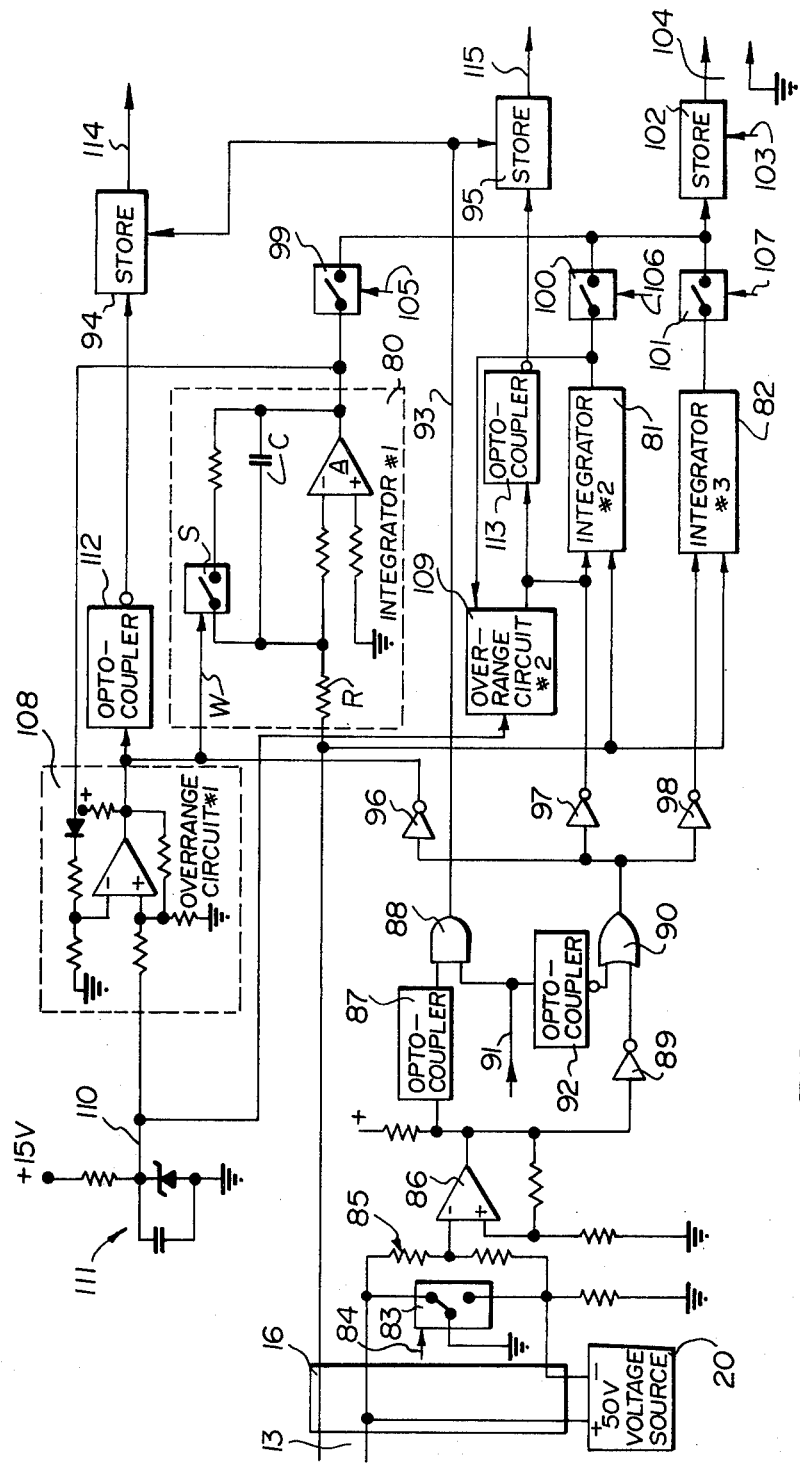
FIG. 4 illustrates a capacitance measurement unit of the apparatus.

FIG. 4 illustrates the capacitance measurement unit 19 in detail, and for convenience also illustrates the source 20, which during capacitance measurement is controlled by the decoder 12 to operate as a constant voltage source, and the connections which during capacitance measurement the switching circuit 16 is caused by the decoder 12 to establish between the source 20, the line 13, and inputs of the unit 19.

As shown in FIG. 4, during capacitance measurement the switching circuit connects one wire of the line 13 to a signal input of each of three integrators 80, 81 and 82; it also connects the other wire of the line 13 to the positive terminal of the source 20 and to a contact of a switch 83, and the negative terminal of the source 20 to another contact of the switch 83, a pole of which is grounded. The switch 83, which is for example constituted by contacts of a relay, is controlled by a signal on a wire 84. The switch 83 is normally in its position shown in FIG. 4, but at the start of a capacitance measurement cycle a signal on the wire 84 causes it to change to its other position to ground the negative terminal of the voltage source 20. Consequently, the line 13 is charged so that its upper wire illustrated in FIG. 3 is a potential of −50 volts with respect to its lower wire illustrated in FIG. 3. The signal on the wire 84 is then terminated so that the switch 83 returns to its position shown. As a result, the line 13 discharges, its discharge current flowing via the ungrounded wire of the line 13 into the integrators 80,81, and 82.

A voltage divider 85 connected between the contacts of the switch 83 supplies a positive potential to the inverting input of a differential amplifier 86 during the charging period of the line 13. Consequently the output of this amplifier 86 is a logic '0' during the charging period, and is otherwise a logic '1'. The output of the amplifier 86 is connected via a non-inverting opto-coupler 87 to one input of a two-input AND gate 88, and is connected via an inverter 89 to one input of a two-input OR gate 90. A wire 91, which normally carries a logic '1' during capacitance measurement, is connected to the other input of the AND gate 88 and via an inverting opto-coupler 92 to the other input of the OR gate 90. The output of the AND gate 88 is connected via a wire 93 to 'clear' inputs of stores 94 and 95, each of which may comprise a D-type flip-flop. The output of the OR gate 90 is connected via respective inverters 96, 97, and 98 to reset inputs of the integrators 80, 81, and 82 respectively.

The integrators 80, 81, and 82 are all of similar form, and accordingly only the integrator 80 is shown in detail. As shown for the integrator 80, each integrator is a Miller integrator consisting of a series input resistance R, an inverting amplifier A, a feedback capacitor C, and a capacitance discharge path constituted by a switch S in series with a 120 Ω resistor, connected in parallel with the capacitor C. The resetting input of the integrator is connected via a wire W to a control input of the switch S; a logic '0' on the wire W causes the switch S to be closed to discharge the capacitor C and thereby reset the integrator. The three integrators have different integration time constants, achieved by the provision of different values of the components R and C. For example, approximate values of these components are 50 kΩ and 0.39 μF in the integrator 80, 250 kΩ and 0.22 μF in the integrator 81, and 2.5 MΩ and 0.22μF in the integrator 82.

The outputs of the integrators 80, 81, and 82 are connected via respective normally-open switches 99, 100, and 101 respectively to the input of an analog store 102, which for example comprises a storage capacitor whose stored voltage is sampled upon occurrence of a signal applied via a wire 103. The output of the store 102 is connected to one wire of a two-wire line 104 the other wire of which is grounded. The line 104 is connected to a second input of the switching circuit 60 in FIG. 3. During capacitance measurement, the switching circuits 60 and 45 in FIG. 3 are controlled by the decoder 12 in FIG. 1 to connect the line 104 to the isolation amplifier 66 and the output of this amplifier to the buffer amplifier 46 and thence to the A-D converter 47. The switches 99, 100, and 101 are controlled individually by signals supplied thereto via wires 105, 106, and 107 respectively.

The outputs of the integrators 80 and 81 are also connected to inputs of respective over-range circuits 108 and 109 respectively, which are identical to one another and of which accordingly only the circuit 108 is shown in detail. Each of the circuits 108 and 109 is also supplied with a reference potential via a wire 110 from a reference potential circuit 111. The output of the circuit 108 is connected to the reset input of the integrator 80 and via an inverting opto-coupler 112 to a signal input of the store 94. Similarly, the output of the circuit 109 is connected to the reset input of the integrator 81 and via an inverting opto-coupler 113 to a signal input of the store 95. Outputs of the stores 94 and 95 are connected via wires 114 and 115 respectively to the microprocessor 10 in FIG. 1. In the case where the stores 94 and 95 are constituted by D-type flip-flops, their D inputs are supplied with a logic '1', their clock inputs are connected to the outputs of the respective opto-couplers, and their Q outputs are connected to the respective wires 114 and 115.

In operation during a capacitance measurement, during charging of the line 13 the logic '0' at the output of the amplifier 86 results in a logic '0' being applied to the reset inputs of the integrators 80, 81, and 82 and to the stores 94 and 95, whereby the integrators are reset and the stores are cleared. As the amplifier 86 is responsive to operation of the switch 83, the resetting signals to the integrators and the clear signals to the stores are terminated at exactly the same time that the charging of the line 13 is terminated, so that discharging of the line 13 and integration by the three integrators 80, 81, and 82 all start simultaneously regardless of delays which may exist in the change-over of the switch 83.

The line discharges simultaneously into the three integrators, causing the output voltage of each integrator to rise at a rate dependent upon the capacitance of the line and the integration time constant of the particular integrator. The output voltage of the integrator 80 rises fastest because this integrator has the smallest integration time constant. If, within a period of 16.6 ms, the output voltage of the integrator 80 exceeds a predetermined voltage supplied by the reference potential circuit 111, then the over-range circuit 108, which basically consists of a comparator, produces a logic '0' at its output which is normally a logic '1'. This logic '0' resets the integrator 80 via its wire W, and is inverted by the opto-coupler 112 to produce a logic '1' which sets the store 94, this being communicated to the microprocessor 10 via the wire 114.

During the 16.6 ms period, the decoder 12 supplies a signal via the wire 105 to close the switch 99, so that the analog store 102 stores a voltage which follows, i.e. is the same as, the output voltage of the integrator 80. At the end of the 16.6 ms period the switch 99 is opened and the output voltage of the integrator 80 at the end of this period is held in the store 102. The decoder 12 supplies a signal via the wire 103 to sample the stored voltage in the store 102 and apply this via the line 104, and the units 60, 66, 67, and 46 in FIG. 3, to the A-D converter 47. If the store 94 has not been set during the 16.6 ms period, then the microprocessor 10 supplies a 'convert' command via the wire 48 to the A-D converter 47 to convert the analog signal, representing the line 13 capacitance, into a corresponding digital value, and this part of the capacitance measurement is terminated. If, however, the store 94 has been set, then the microprocessor 10 does not supply the 'convert' command on the wire 48, and this part of the capacitance measurement is continued as described below.

Assuming that the store 94 has been set, then following the end of the 16.6 ms period the decoder 12 supplies a signal via the wire 106 to close the switch 100, so that the analog store 102 now follows the output voltage of the integrator 81 which rises at a slower rate than that of the integrator 80. At the end of a period 83.3 ms from the start of the discharge of the line 13, the switch 100 is opened to hold the output voltage of the integrator 81 at this time in the analog store 102, and the stored voltage is sampled by a signal on the wire 103 in the same manner as described above and is applied to the A-D converter. The store 94, overrange circuit 109, and opto-coupler 113 operate in the same manner as the components 94, 108, and 112 respectively. In dependence upon whether or not the store 95 is set during the 83.3 ms period, as communicated to the microprocessor 10 via the wire 115, the microprocesor either does not or does, respectively, supply a 'convert' command to the A-D converter 47 via the wire 48, and this part of the capacitance measurement is not or is, respectively, terminated. If the store 95 is set during the 83.3 ms period, then after this period the switch 101 is closed by a signal from the decoder 12 via the wire 107, and at the end of a period of 833.3 ms from the start of the discharge of the line 13 the switch 101 is opened, the resultant voltage stored in the store 102 is sampled and supplied to the A-D converter 47, which is supplied with a 'convert' command from the microprocessor 10 via the wire 48. No overrange circuit is provided for the integrator 82, and an excessive line 13 capacitance is determined by an excessive signal being supplied from the store 102 to the A-D converter 47.

A significant feature of the circuit arrangement as described above is that the overrange circuits 108 and 109 reset the integrators 80 and 81 respectively (this resetting may occur repeatedly depending on the line capacitance) so that the integrators are not allowed to saturate. In consequence, their input resistances are maintained constant so that the line 13 discharges into a constant impedance.

It will be noted that the first part of the capacitance measurement as described above is terminated after a period which is dependent upon the capacitance of the line 13. For example, if the line capacitance is small the measurement procedure is terminated shortly after the end of the 16.6 ms period, whereas if the line capacitance is very large it is not terminated until shortly after the 833.3 ms period. This feature, which is afforded by the provision of the three integrators rather than merely a single integrator having a long integration time constant to provide the same capacitance measurement range, considerably reduces the average time taken for making a plurality of capacitance measurements. It will also be noted that the periods of 83.3 ms and 833.3 ms are integral multiples of the 16.6 ms period, which is the period of a 60 Hz signal. Thus each integration is effected over an integral number of periods of 60 Hz a.c. supplies, thereby rejecting interference and resultant measurement inaccuracy which would otherwise be caused by 60 Hz a.c. voltages which may be present in the line 13.

The first part of the capacitance measurement described above results in a measured value which is subject to considerable error due to any small direct voltages which may exist on the line 13. In order to correct for this error a second capacitance measurement is made and a second measured value is produced which represents the effect of such direct voltages.

In order to conduct the second capacitance measurement, upon termination of the first part of the capacitance measurement as described above and consequently with the line 13 discharged, the decoder 12 supplies for a short time a logic '0' on the wire 91 which normally carries a logic '1'. The logic '0' resets the integrators 80, 81 and 82 via the inverting opto-coupler 92, OR gate 90, and inverters 96 to 98, and clears the stores 94 and 95 via the AND gate 88. On return of the signal on the wire 91 to a logic '1' the second capacitance measurement is made, in exactly the same manner as described above, without any initial charging of the line 13. The resultant second measured valve, representing the effect of any small direct voltages on the line 13 and supplied from the A-D converter 97 to the microprocessor 10, is subtracted by the miroprocessor 10 from the first measured value to provide a resultant, more accurate, capacitance measurement.

A further source of error in the capacitance measurement arises from the leakage resistance of the line 13, because this leakage resistance appears across the line as a second discharge path which shunts part of the current to the integrators 80, 81, and 82. The microprocessor 10 can also compensate for this error by arranging for the leakage resistance of the line 13 to be determined as already described above in the FL mesurement, and by modifying the capacitance measurement to take into account the effect of this leakage resistance. Only a residual error in the capacitance measurement remains, due to a lack of knowledge of what percentage of the determined leakage resistance is actually loop resistance.

By way of example, it is observed that a test apparatus constructed in accordance with the above described embodiment of the invention provided for measurement of:

a.c. voltage up to 200 volts R.M.S. with an accuracy of ±5%;

d.c. voltage up to 30 volts on the low range and up to 300 volts on the high range with an accuracy of ±5%, low resistance up to 1 kΩ on the low range and up to 10 kΩ on the high range with an accuracy of ±1% of full scale, and FL measurements with an accuracy of ±1% for equivalent voltage (foreign emf.) and resistance (leakage resistance) values which produce currents up to 2.5 mA (e.g. 25 volts and 10 kΩ) on the low range and up to 0.25 mA (e.g. 25 volts and 100 kΩ) on the high range, all in the presence of up to 25 volts R.M.S. of 60 Hz a.c. on the line; and capacitance from 0.001 μF to 1 μF with an accuracy of ±3%, and from 1 μF to 10 μF with an accuracy of ±5%, both in the presence of up to 25 volts R.M.S. of 60 Hz a.c. on the line and with a leakage resistance of ≧2MΩ, slightly less accurate capacitance measurements being obtained with leakage resistances down to 100 kΩ and in the presence of d.c. voltages up to 6 volts on the line.

As has already been explained, the test apparatus can be used to perform specific measurements on specific telephone lines as needed. However, the apparatus is particularly useful when it is desired to perform a comprehensive determination of the electrical characteristics of a large number of lines sequentially. In this case the speed of measurement is especially important. Such a sequential measurement of the characteristics of a single telephone line, using the above-described test apparatus, is described below. Although not discussed below, it is observed that each individual measurement, e.g. a.c. voltage measurement or FL measurement, is carried out sequentially for the tip and ring wires, the tip and ground, and ring and ground of the respective line, before the particular next individual measurement, e.g. FL measurement or capacitance measurement, is started. This ensures that, in the event of a fault existing on a line which would preclude obtaining valid subsequent measurements in respect of that line, the testing of the line is discontinued (the fault being recorded) and the overall testing speeded up. On average, a complete set of measurements can be performed within about ten seconds per telephone line.

Initially, the a.c. voltage on the line is measured using the a.c. measurement unit 17. If the measured a.c. voltage is less than 25 volts R.M.S. the testing of the line is continued, otherwise it is terminated.

Secondly, an FL measurement of the line is conducted using the unit 18. This measurement in particular enables ready identification of certain types of customer equipment, of known foreign voltage and impedance, which may be connected to the line. For example, in normal operation a private branch exchange (PBX) applies −48 volts and 20 kΩ impedance to the tip of a PBX office trunk.

If the FL measurement indicates a foreign emf of up to 6 volts and a leakage resistance of at least 100 kΩ, then a capacitance measurement is effected by the unit 19, the measured value being corrected by the microprocessor 10 to take into account the previously measured value of the leakage resistance. In this case the testing of the particular line is concluded after completion of the capacitance measurement. If, however, the FL measurement is within range but indicates a foreign emf more than 6 volts or a leakage resistance of less than 100 kΩ, then a capacitance measurement is not made and the testing of the line is concluded after completion of the FL measurement.

If the FL measurement indicates that the combination of voltage and resistance of the line causes a current which is outside of the FL measurement range, then no capacitance measurement is made. In this case the unit 18 makes separate measurements of the d.c. voltage on the line and the resistance across the line, after which testing of the line is concluded.

It can thus be seen that the present invention enables the provision of a test apparatus which can rapidly and accurately perform a comprehensive set of electrical measurements on telephone lines, and can be located remotely from a central unit. Such a test apparatus is very useful in fault location and monitoring of telephone lines.

Whilst a preferred embodiment of the invention has been described in detail, it is obvious that this may be modified, varied, and adapted in many different ways without departing from the scope of the invention as defined in the claims. In particular, it is observed that whilst the embodiment of the invention described above incorporates a microprocessor and a decoder for calculating measured results and producing control signals, these could be replaced by logic circuitry specifically provided for the desired purposes and a display device could be provided for displaying the results. In addition, the switching circuits could be provided in different forms; for example the relays referred to could be replaced by manually operable switches permitting direct manual control of the switching functions.

The embodiments of the invention in which an exclusive property or privilege is claimed are defined as follows:

1. Apparatus for determining the capacitance of a transmission line, comprising;
   a plurality of integrators having different integration time constants;
   means for charging the line to a predetermined voltage, and for discharging the line and integrating the discharge current simultaneously in the plurality of integrators;
   comparison means, associated with at least each integrator except that having the largest integration time constant, for producing a signal if an output voltage of the respective integrator exceeds a predetermined level; and
   sampling means for sampling the output voltage of that one of the integrators which has the smallest integration time constant and in respect of which no said signal is produced within a predetermined period commencing with the start of the discharge, said signal(s) and the sampled output voltage constituting a measure of said capacitance.

2. Apparatus as claimed in claim 1 wherein said sampling means is arranged for sampling the output voltage of each integrator at the end of a predetermined period individually assigned to the respective integrator, each integrator having a relatively larger integration time constant being assigned a relatively longer predetermined period.

3. Apparatus as claimed in claim 2 wherein each predetermined period is equal to an integral number of periods of an alternating current of a predetermined frequency which may be carried by the transmission line.

4. Apparatus as claimed in claim 3 wherein each predetermined period is an integral multiple of 16.6 milliseconds.

5. Apparatus as claimed in claim 1 and including resetting means, associated with at least each integrator except that having the largest integration time constant, responsive to said signal being produced by the comparison means associated with the respective integrator to reset the respective integrator, whereby at least each integrator except that having the largest integration time constant is prevented from saturating and presents a constant impedance to the discharge current.

6. Apparatus as claimed in claim 1 and including means for storing said signal(s) produced by said comparison means.

7. Apparatus as claimed in claim 1 and including means for resetting the integrators after said sampling by said sampling means, and for effecting a second integration, comparison, and sampling in respect of current from the line, without any further charging of the line, to produce a second measure which can be subtracted from the first measure of said capacitance to produce a resultant, more accurate, measure of said capacitance.

8. Apparatus as claimed in claim 7 and including means for subtracting said second measure from said first measure to produce said resultant measure of said capacitance.

9. Apparatus as claimed in claim 8 and including means for modifying said resultant measure of said capacitance in accordance with a measure of the leakage resistance of the transmission line to produce a final, more accurate, measure of said capacitance.

10. Apparatus as claimed in claim 1 or 9 and including means for determining values of direct voltage applied to and leakage resistance of the transmission line, comprising:
    a constant voltage source;
    a low-pass filter
    a resistance network;
    means for connecting said resistance network of said transmission line in a first step to develop across a resistance of said resistance network a first direct voltage which is dependent upon current flow in the transmission line, and for connecting said resistance network in series with said constant voltage source to said transmission line in a second step to develop across a resistance of said resistance network a second direct voltage which is dependent upon current flow in the transmission line; and
    means responsive to said first and second direct voltages, filtered by said low-pass filter, for calculating said values of direct voltage applied to and leakage resistance of the transmission line.

11. Apparatus as claimed in claim 10 wherein said low-pass filter comprises a plurality of low-pass filter sections and a notch filter section having a high attenuation at a predetermined frequency of an alternating current which may be carried by the transmission line.

12. Apparatus as claimed in claim 11 wherein said notch filter section has a high attenuation at a frequency of 60 Hz.

13. Apparatus for determining electrical characteristics of a transmission line, comprising:
    means for measuring a.c. voltage on the line;
    means for selectively connecting the line to the a.c. voltage measuring means;
    d.c. measuring means comprising at least one resistance network including a resistance across which a direct voltage may be developed and a low-pass filter for filtering signals supplied to and/or the direct voltage developed across said resistance upon connection of the line to said resistance network, said low-pass filter including a notch filter section having a high attenuation at a predetermined frequency of an alternating current which may be carried by the line;
    a source of constant voltage;
    means for selectively connecting the resistance network of the d.c. measuring means to the line either directly or in series with the constant voltage source, whereby different voltages are developed in the d.c. measuring means for determining values of direct voltage applied to and leakage resistance of the line; and means for measuring the capacitance of the line, said capacitance measuring means comprising a plurality of integrators having different integration time constants, means for selectively connecting the constant voltage source to the line to charge the line and for connecting the line to discharge with the discharge current being integrated simultaneously in the plurality of integrators, comparison means, associated with at least each integrator except that having the largest integration time constant, for producing a signal if an output voltage of the respective integrator exceeds a predetermined level, and sampling means for sampling the output voltage of that one of the integrators which has the smallest integration time constant and in respect of which no said signal is produced within a predetermined period commencing with the start of the discharge, said signal(s) and the sampled output voltage constituting a measure of sid capacitance.

14. Apparatus as claimed in claim 13 wherein the capacitance measuring means includes means for resetting the integrators after said sampling by said sampling means, and for effecting a second integration, comparison, and sampling in respect of current from the line, without any further charging of the line, to produce a second measure equivalent to a capacitance, means for subtracting the second measure from the first measure to produce a resultant measure of said capacitance, and means for modifying said resultant measure in accordance with the determined leakage resistance of the line to produce a final, more accurate, measure of said capacitance.

15. Apparatus as claimed in claim 11 or 13 wherein said notch filter section comprises two input wires and two output wires, a resistor, connected in parallel with a capacitor, in series between each input wire and a respective one of the two output wires, and a resistor, connected in series with a capacitor, connected between each input wire and the respective other of the two putput wires.

16. Apparatus as claimed in claim 10 or 13 wherein the means for connecting the resistance network in series with the constant voltage source to the line is arranged to connect said constant voltage source to oppose the direction of current flow in the transmission line.

17. A method of determining the capacitance of a transmission line comprising the steps of:
charging the line to a predetermined voltage;
discharging the line and integrating the discharge current simultaneously in a plurality of integrators having different integration time constants;
comparing an output voltage of at least each integrator except that having the largest integration time constant with a predetermined level and producing a signal if the output voltage of the respective integrator exceeds the predetermined level; and
sampling the output voltage of that one of the integrators which has the smallest integration time constant and in respect of which no said signal is produced within a predetermined period commencing with the start of the discharge, to produce a measure of said capacitance.

18. A method as claimed in claim 17 and further comprising the steps of:
resetting the integrators after said sampling; and
effecting a second integration, comparison, and sampling in respect of current from the line, without further charging of the line, to produce a second measure equivalent to a capacitance, which second measure can be subtracted from the first measure of said capacitance to produce a resultant, more accurate, measure of said capacitance.

19. A method of determining the capacitance of a transmission line, comprising the steps of:
charging the line to a predetermined voltage;
discharging the line and integrating the discharge current to produce a first measure of the capacitance of the line; and
integrating current from the discharged line to produce a second measure equivalent to a capacitance, and subtracting said second measure from the first measure to produce a resultant, more accurate, measure of said capacitance.

20. A method as claimed in claim 18 and further comprising the step of subtracting said second measure from said first measure to produce said resultant measure of said capacitance.

21. A method as claimed in claim 14 or 20 and further comprising the step of modifying said resultant measure of said capacitance in accordance with a measure of the leakage resistance of the transmission line to produce a final, more accurate, measure of said capacitance.

22. A method as claimed in claim 21 and further comprising the step of determining the leakage resistance of the line prior to the determination of said capacitance.

23. A method as claimed in claim 22 and further comprising the step of measuring a.c. voltage on the line prior to the determination of said leakage resistance, and filtering out a.c. voltages at a predetermined frequency in the determination of said leakage resistance.

24. A method as claimed in claim 23 wherein each integration is effected during a period which is an integral multiple of the period of said predetermined frequency.

25. A method as claimed in claim 24 wherein said predetermined frequency is 60 Hz.

* * * * *